US007544520B2

(12) United States Patent
Duda et al.

(10) Patent No.: US 7,544,520 B2
(45) Date of Patent: Jun. 9, 2009

(54) METHOD FOR THE APPLICATION OF A PROTECTIVE COATING TO A THERMALLY STRESSED COMPONENT

(75) Inventors: Thomas Duda, Wettingen (CH); Stefan Kiliani, Essen (DE); Alexander Stankowski, Siggenthal-Station (CH); Frigyes Szücs, Langenbruck (CH)

(73) Assignee: ALSTOM Technology Ltd., Baden (CH)

( * ) Notice: Subject to any disclaimer, the term of this patent is extended or adjusted under 35 U.S.C. 154(b) by 183 days.

(21) Appl. No.: 11/553,748

(22) Filed: Oct. 27, 2006

(65) Prior Publication Data

US 2007/0063351 A1 Mar. 22, 2007

Related U.S. Application Data

(63) Continuation of application No. PCT/EP2005/051748, filed on Apr. 20, 2005.

(30) Foreign Application Priority Data

Apr. 28, 2004 (EP) .................................. 04101784

(51) Int. Cl.
*H01L 21/00* (2006.01)

(52) U.S. Cl. ........................... 438/4; 438/751; 427/142; 257/E21.529; 257/E21.53

(58) Field of Classification Search ..................... 438/4, 438/751, 737, 738, 785; 427/142, 307, 327; 257/E21.529, E21.53
See application file for complete search history.

(56) References Cited

U.S. PATENT DOCUMENTS 5,667,700 A * 9/1997 Rudigier et al. ............... 216/12

(Continued)

FOREIGN PATENT DOCUMENTS

EP 0808913 11/1997

(Continued)

OTHER PUBLICATIONS

Search Report for EP Patent App. No. 04101784.9 (Aug. 25, 2004).

(Continued)

*Primary Examiner*—Caridad M Everhart
(74) *Attorney, Agent, or Firm*—Cermak Kenealy Vaidya & Nakajima LLP; Adam J. Cermak

(57) ABSTRACT

A method for applying a heat insulation layer (11, 12, 13) or a metallic protective layer to a thermally stressed component (200) having a basic material (10) in order to eliminate local damage (14) or an untreated place in the coating, includes, in a first step, pretreating the local damage (14) or untreated place, and, in a second step, applying layers (17, 18) necessary for eliminating the local damage (14) or untreated place. A markedly improved lifetime of the processed component can be achieved in that, within the first step, the edge regions (15) of the layers (11, 12, 13) ending at the local damage (14) or untreated place are processed so that they form uniformly sloped and terrace-shaped edge regions (16). Furthermore, a precharacterization of the entire coated region of the operationally stressed component or critical places by FSECT makes it possible to reduce the risk in terms of otherwise overlooked layer regions, the remaining lifetime of which would not persist for the following operating time.

29 Claims, 5 Drawing Sheets

U.S. PATENT DOCUMENTS

| | | | |
|---|---|---|---|
| 5,735,448 | A | 4/1998 | Draghi et al. |
| 5,958,166 | A * | 9/1999 | Walters et al. ................ 156/94 |
| 6,042,880 | A | 3/2000 | Rigney et al. |
| 6,203,847 | B1 | 3/2001 | Conner et al. |
| 6,235,352 | B1 | 5/2001 | Leverant et al. |
| 6,274,193 | B1 | 8/2001 | Rigney et al. |
| 6,305,077 | B1 | 10/2001 | Conner et al. |
| 6,465,040 | B2 | 10/2002 | Gupta et al. |
| 6,605,364 | B1 | 8/2003 | Conner et al. |
| 6,637,643 | B2 | 10/2003 | Hasz et al. |
| 6,707,297 | B2 * | 3/2004 | Nath et al. .................. 324/240 |
| 7,309,512 | B2 | 12/2007 | Srinivasan |
| 2003/0082297 | A1 | 5/2003 | Wolkers et al. |
| 2007/0231474 | A1 | 10/2007 | Srinivasan |

FOREIGN PATENT DOCUMENTS

| | | |
|---|---|---|
| EP | 1217090 | 6/2002 |
| EP | 1408134 | 4/2004 |
| WO | 2005/106075 | 11/2005 |

OTHER PUBLICATIONS

International Search Report for PCT Patent App. No. PCT/EP2005/051748 (Sep. 15, 2005).

* cited by examiner

METHOD FOR THE APPLICATION OF A PROTECTIVE COATING TO A THERMALLY STRESSED COMPONENT

This application is a Continuation of, and claims priority under 35 U.S.C. § 120 to, International application number PCT/EP2005/051748, filed 20 Apr. 2005, and claims priority under 35 U.S.C. § 119 therethrough to European application number No 04101784.9 filed 28 Apr. 2004, the entireties of both of which are incorporated by reference herein.

BACKGROUND OF THE INVENTION

1. Field of the Invention

The present invention relates to the field of thermal machines and components which are subjected to high thermal stress in use and are provided with a heat insulation layer or a metallic protective layer. It refers, in particular, to a method for the repair of damaged places on these layers.

2. Brief Description of the Related Art

Components subjected to high thermal stress, such as are used, for example, in the blading, the lining of the combustion chamber, or as protective shields in the hot-gas duct of a gas turbine, are often covered with a metallic protective layer or with a multilayer heat insulation layer, in order to protect the basic material lying underneath it against the high hot-gas temperatures. The multilayer heat insulation layer in this case includes a bonding layer (bond coating BC) applied to the basic material and the actual heat insulation layer (thermal barrier coating TBC) which mostly consists of a ceramic material. During operation, a thermally grown oxide layer (thermally grown oxide TGO) also forms at the boundary between the bonding layer and the heat insulation layer and protects the bonding layer against further oxidation and corrosion and further improves the bonding of the heat insulation layer for a specific lifetime range.

Owing to the constant alternating thermal load and influence of the flowing hot gases and of foreign bodies entrained in the hot-gas stream, it may happen that, during operation over a lengthy period of time, there are local peelings (and consumption, for example, due to erosion) of the protective coating which then have to be rectified as quickly and as reliably as possible, so that operation can be resumed as quickly as possible and maintained, undisturbed, for as long as possible. For rectification, the sequence of layers of the protective coating has to be built up again in succession in the regions of the local damage, so that the component is fully protected again.

It is also conceivable, however, that, on a component which is otherwise provided with a protective coating, there are from the outset untreated places, for example weld seams or the like, which are free of protective coating and which subsequently have to be provided locally with a protective coating in the form of a metallic protective layer or of a ceramic heat insulation layer.

A method for rectifying a metallic protective layer has already been described in the publication U.S. Pat. No. 6,569, 492. EP-B1-0 808 913 discloses a method for rectifying a ceramic heat insulation layer.

Further rectification methods are known from the publications U.S. Pat. Nos. 5,735,448, 6,042,880, 6,203,847, 6,235, 352, 6,274,193, 6,305,077, 6,465,040, 6,605,364, EP1304446A1 and U.S. Pat. No. 5,972,424.

In the known rectification methods for protective coatings, the following problems arise:

It is in the nature of metallic protective layers or PC/TBC multilayer systems that the edges of the damaged or peeled-off places have a random configuration without a specific form. There has hitherto been no proposal for classifying the damage as a precondition for a decision on repairability and the use of a corresponding standardized preparation of the damaged place.

Regions which have been predamaged during operation in the metallic protective layer or the BC/TBC multilayer system, but do not appear visibly, cannot be detected in the known methods and therefore also cannot be repaired. This results in a high risk of failure of the component, even if the coating has been rectified locally. So that a full lifetime cycle can be ensured, the entire coated surface or, in particular, the regions put at risk, that is to say regions subjected to particularly high thermal mechanical load, must be examined for mechanical integrity by means of a suitable nondestructive test method.

Since the edge regions of the damaged coating surfaces are irregular, they may be very steep and not have a sufficient slope between the basic material, the BC layer, and the TBC layer. If special precautions are not taken, this may result in uncontrolled preparation during cleaning (including the risk of damaging the contiguous intact coating surfaces), and an overlap effect may occur during the subsequent recoating. This may lead to mismatches in the BC/TBC multilayer system. Components repaired in this way are exposed to a high risk of local peeling on account of a local mismatching of the coefficients of thermal expansion under thermal alternating load. According to the known rectification methods, the local repair of protective coatings is carried out outside the thermal machine. This requires the demounting and transport of the components to be repaired and leads to losses of time and increased costs.

SUMMARY OF THE INVENTION

One aspect of the present invention includes a method for the rectification of local damage or for filling up local untreated places, which avoids the disadvantages of known methods and is distinguished, in particular, by a high quality and load-bearing capacity of the processed regions. In particular, the method is capable of being carried out on the spot on components installed in the machine (on-site) and on components demounted from the machine (off-site).

Another aspect of the present invention includes, during the pretreatment of the places to be processed, processing the edge regions of the layers ending at the local damage or untreated place, in such a way that the layers are stripped away in steps in the edge regions, in that the circumference of the stripped-away surface of the individual layers decreases in steps from the outermost layer of the component as far as the surface of the basic material and a mask of appropriate size is used for defining the size of that surface of each layer which is to be stripped away. The edge regions of the individual layers are therefore processed in succession, in that each layer is stripped away through and by means of a mask assigned to it. Using masks which are adapted with the size of their mask aperture to each layer of the layer sequence, the geometry and form of the critical edge layers can be set reliably and accurately during processing.

Within a second step of an exemplary method according to the invention, for the purpose of refilling the damaged place, the new layers are applied by means of masks according to the size of the stripped-away layer. The use of masks of various sizes one after the other avoids overlaps of the applied layers with the contiguous layers present. By means of the masks, the lateral extent of the applied layer regions can be limited such that the applied layers do not at the edge significantly overlap the layers already present and therefore form edge regions of reduced strength and stability which are conducive to later peeling off. The masks used in the application of the layers have mask apertures which increase successively in the same way as in the case of the masks for processing.

Preferably, the individual layers are stripped away in the edge regions of the local damage in such a way that the ends of the individual layers are sloped uniformly. A uniform slope of the layer ends is achieved, for example, by means of a sandblasting method. The amount of slope, that is to say the angle of the slope in relation to the surface normal, depends in this case on the sandblasting parameters and the material parameters of the layers to be stripped away. The slope forms an angle in relation to the surface normal in a range of 30° to 75°, preferably of 60°. The slope achieved is uniform in so far as the angle of the slope is essentially identical within a layer and over the entire circumference of the damaged place, that is to say is identical in so far as it can be achieved by means of a sandblasting method or other blasting method. The uniformly sloped edge regions thus go from the bottom upward along the layer sequence, that is to say from the surface of the basic material toward the outermost layer of the layer sequence, increasingly outward and back in steps, so that a series of "terraces" with sloped walls between the terrace levels is obtained.

Stepping the stripping away of the layers affords the advantage that, when the corresponding new layers are applied for the purpose of filling up the damaged place, overlaps from layer to layer are avoided, and new layer material is applied only to the layer intended for it and does not pass on to the following layer.

The sloped ends of the layers afford the additional advantage of an improved bonding of the newly applied layers.

Preferably, for safety reasons, a sufficiently broadly selected region of the layers ending at the local damage or untreated place is stripped away, so that irregularities in the critical edge regions can be reliably ruled out. That is to say, not only are the obviously damaged places stripped away, but also regions around the obvious damaged place, which likewise have to be repaired on account of cracks or a damaged bonding layer (BC). The areal extent of the damaged place which has to be repaired is thus defined. Furthermore, the depth extent of the damaged place is also defined, that is to say which part regions of the composite layer formation have to be repaired, such as, for example, only TBC or TBC/BC or TBC/BC/BM. The amount of the region selected for repair and the presence of hidden damaged regions are detected, for example, by means of a nondestructive method, such as FSECT (Frequency Scanning Eddy Current Technique).

Preferably, masks with a rounded, in particular circular, mask aperture are used. The use of such a mask form, in contrast to a form with corners, avoids stresses which could emanate from pointed corners.

A particularly high quality of the rectified or filled-up region is obtained when, within the second step, before the application of a layer, the surface of the layer lying underneath is processed, for example roughened, in order to improve the bonding of the layer to be applied. This takes place preferably by means of sandblasting or blasting with ceramic blasting material.

In order to obtain as smooth a surface of the coated component as possible after and in spite of the repair, it is advantageous if, after the application of the layers, the surface is processed in the region of the prior local damage or untreated place in order to eliminate unevennesses, this preferably taking place by means of grinding and/or polishing.

In order to obtain reliable evidence of the success of a repair, it is advantageous if, after the elimination of the local damage or untreated place, the region of the prior local damage or untreated place is subjected to a quality test. This takes place preferably by means of nondestructive methods, in particular thermography or FSECT (Frequency Scanning Eddy Current Technique).

The method according to the invention has proved appropriate in a coating which constitutes a heat insulation layer system which includes a bonding layer applied to the basic material and a heat insulation layer applied to the bonding layer.

Advantageously, the method is carried out on the spot on installed components, small portable processing systems, in particular for cleaning and plasma spraying, being used for processing the local damage or untreated place. The method is likewise also suitable, of course, for off-site repairs on demounted components.

The method according to the invention is suitable both for components which have been damaged during operational use and for new components which have been damaged, for example, during assembly or during transport.

So that a component can be treated in full within the scope of the method according to the invention, it is advantageous if, in the first place, the surface of the component is examined for mechanical integrity at least in regions which are at particular risk such as, for example, the pressure side and leading edge of turbine blades, by means of a nondestructive test method, and in this case the areas to be repaired are identified and their extent is defined. For this purpose, preferably, FSECT (Frequency Scanning Eddy Current Technique) is used.

BRIEF DESCRIPTION OF THE DRAWINGS

The invention will be explained in more detail below by means of exemplary embodiments, in conjunction with the drawing in which.

DETAILED DESCRIPTION OF EXEMPLARY EMBODIMENTS

A first step for rectifying a damaged metallic or BC/TBC coating on the basic material of a component includes a division of the defects into specific categories, followed by the decision as to which defective coating part region can be rectified and by which standardized methods. For this purpose, the entire coated surface of the component, or at least the areas which are at particular risk, are investigated for mechanical integrity by means of nondestructive test methods. A nondestructive test method which comes under particular consideration in this case is FSECT (Frequency Scanning Eddy Current Technique), in which the eddy currents induced in the component are investigated and evaluated as a function of the frequency.

Figure 3:
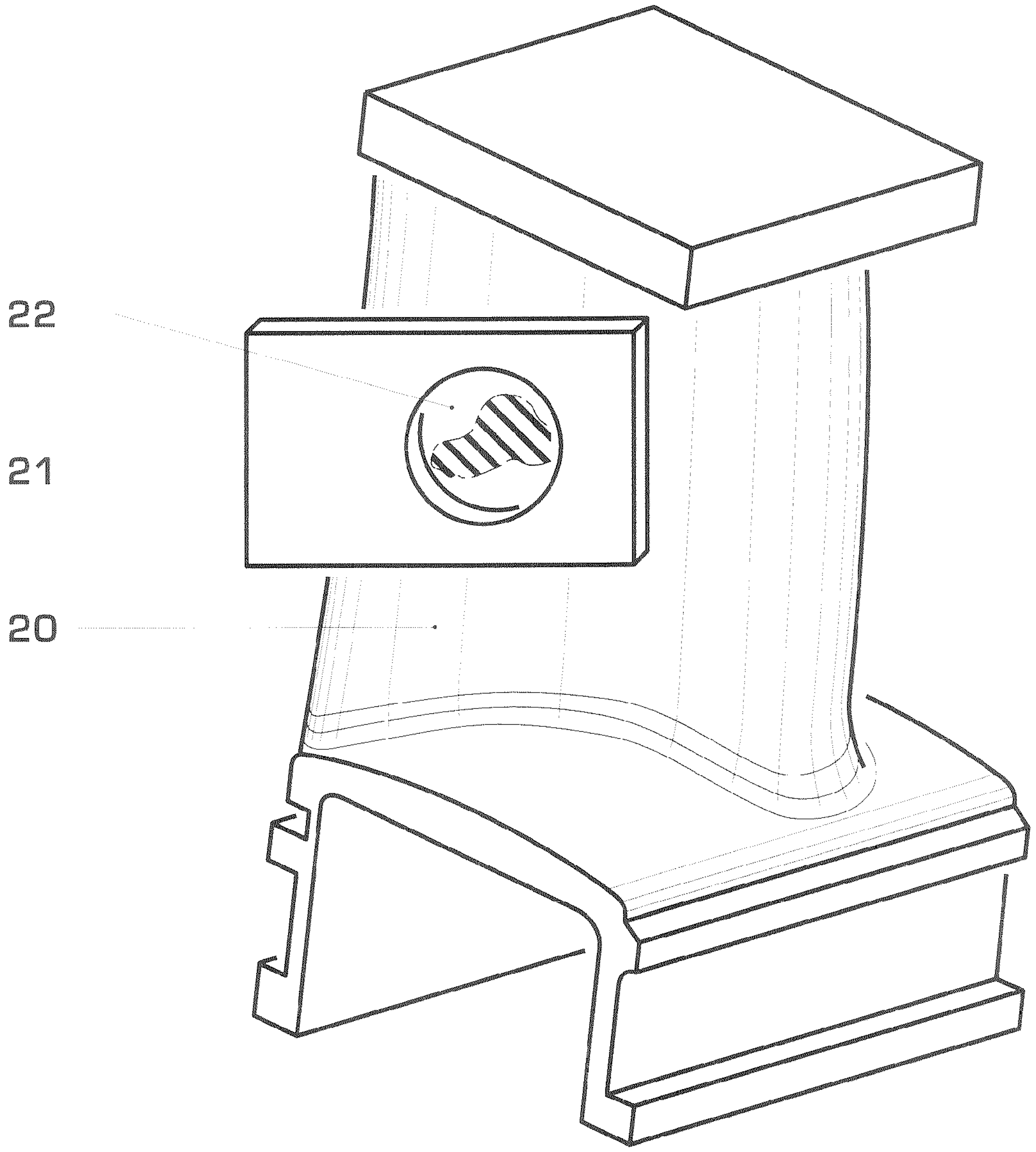
FIG. 3 shows a diagrammatic perspective illustration of the use of a typical mask for the pretreatment and recoating of local damage or of an untreated place.
Figure 7:
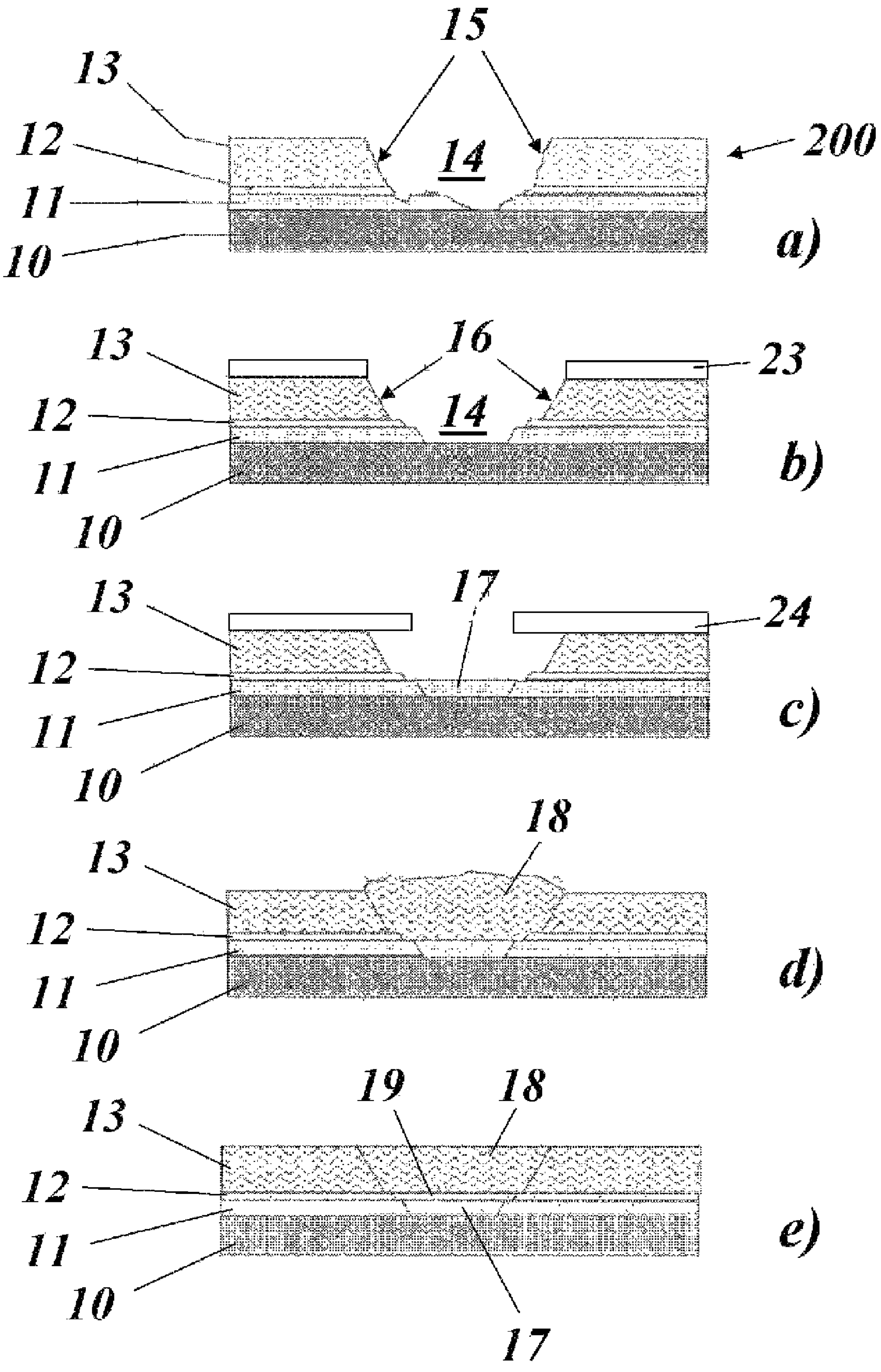
FIG. 7 shows, in various part figures, different steps in the rectification on the spot or off-site of local damage to an operationally stressed component provided with a heat insulation layer, in a preferred exemplary embodiment of the method according to the invention.

When these preparatory investigations are concluded, masks 21 of the type illustrated in FIG. 3 are selected, the mask apertures 22 of which correspond to the extent of the defect. That is to say, the mask apertures cover the size of the obvious damaged place and further regions around this obvious damaged place which have been assessed as damaged by virtue of a nondestructive inspection (including a safety addition). The size of the mask aperture 22 is in this case selected such that, for safety reasons, an edge region of sufficient width is always stripped away in the layer to be stripped away, so as to remove all damaged areas reliably, but without impairing the undamaged areas of the layer. The masks 21 are laid onto the substrate or component 20, whereupon the damaged coating is successively stripped away through the mask aperture 22. Masks 21 with mask apertures 22 of different size, more precisely with a successively smaller size, are used one after the other, in order to remove the metallic protective layer or the TBC layer, the BC layer and any oxidized basic material of the substrate. With the use of the masks 21, a new step or "terrace level" is produced in each layer. The steps resulting from this are illustrated in FIG. 7*b*. The method can also be carried out in that the masks used one after the other become successively larger, that is to say first the smallest mask and lastly the largest mask are used. If, for example, sandblasting is used as a stripping-away method, uniformly sloped edge regions 16 are produced in FIGS. 1, 7, and 8. These are critical for the subsequent rectification or filling-up process, in particular for the bonding of the newly applied layers.

Figure 4:
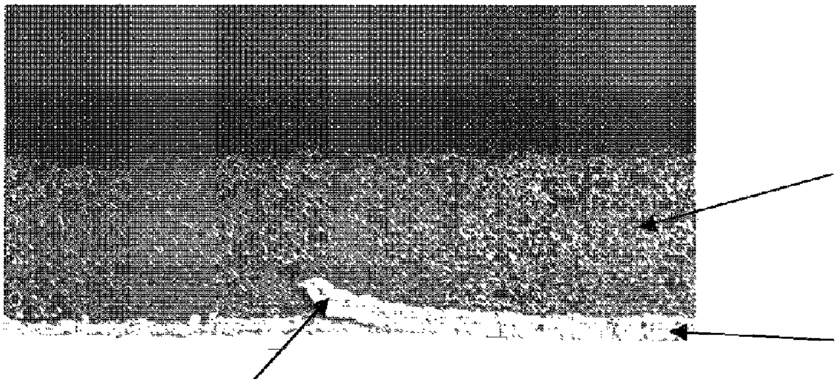
FIG. 4 shows a micrograph through repaired local damage with overlapping of the renewed bonding layer, which overlapping occurs because of the absence of masking and would be avoided by means of the method according to the invention.
Figure 5:
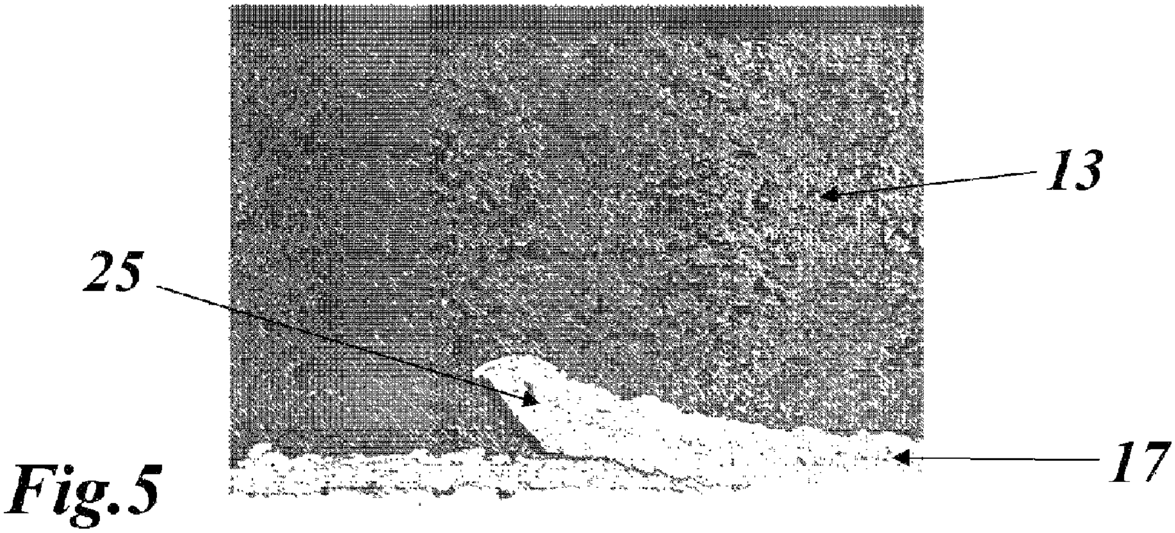
FIG. 5 shows an enlarged illustration of the micrograph from FIG. 4.
Figure 6:
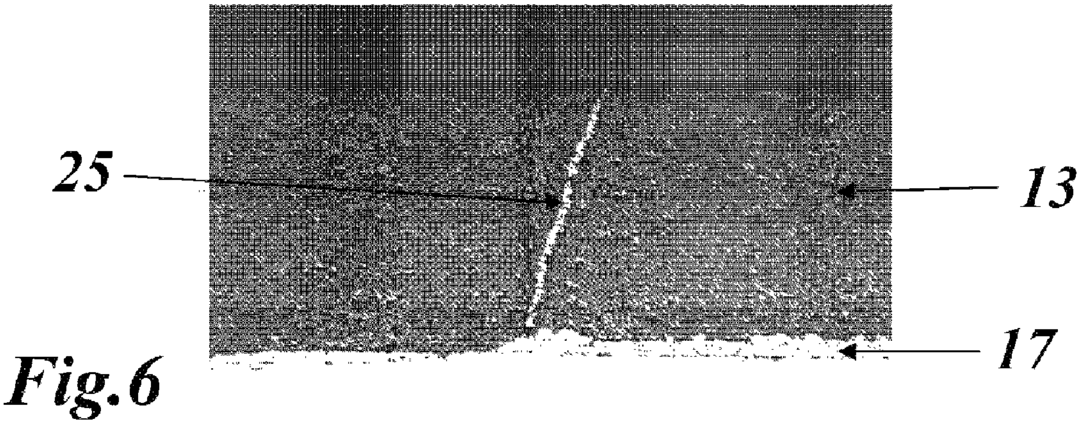
FIG. 6 shows a micrograph of an overlap of the renewed bonding layer along a sloped edge of the heat insulation layer, said micrograph being obtained when work is carried out without masks or with unsuitable masks.

In the subsequent application of new TBC/BC layer sequences or metallic protective layers, equivalent or identical masks are used in order to limit the lateral extent of the newly applied layers and thus to prevent edge overlaps of the newly applied layers and of the existing layers from occurring. Examples of overlaps of this kind are shown in FIGS. 4, 5, and 6. FIGS. 4 and 5 show, in a different magnification, micrographs of an edge overlap 25 of a subsequently applied bonding layer 17, the result of this overlap being that the ceramic heat insulation layer 13 lying above it experiences mechanical weakening there. FIG. 6 shows an overlap 25 on an oblique edge region of the heat insulation layer 13, said overlap likewise leading to mechanical weakening.

FIG. 7 reproduces, in various part figures, different steps in the rectification of local damage to a component 200 provided with a BC/TBC heat insulation layer system, in a preferred exemplary embodiment of the method according to the invention. According to FIG. 7*a*, to protect the component 200, the basic material 10 of the component 200 has applied to it a layer sequence of a bonding layer 11, a thermally grown oxide layer 12, and a ceramic heat insulation layer 13 which has local damage 14. The individual layers 11, 12, and 13 have irregularly formed edge regions 15 in the region of the local damage 14.

When the local damage 14 is discovered and selected for repair, according to FIG. 7*b*, in a first step, the irregular edge regions 15 of the layers are successively stripped away through suitable masks 23, so that all the layers 11, 12, 13 have uniformly sloped edge regions 16 which border an opening in the layer sequence with a diameter increasing outward. Only one mask 23 is depicted in FIG. 7*b*. In actual fact, the individual layers 11, 12, 13 are stripped away one after the other in part steps, using a mask coordinated in each case with the layer, so that, in the case of the three layers 11, 12, 13, at least three masks 23 are employed.

For stripping away the layer 13, a first mask is used, having the size of the largest opening, that is to say the opening 14 on the upper surface of the layer 13. Stripping away is then carried out up to the surface of the layer 12. The next mask possesses an aperture with a slightly smaller size, that is to say, that of the opening 14 on the upper surface of the layer 12. Stripping away is then carried out up to the surface of the layer 12. The next mask, in turn, is smaller with an aperture identical to the opening 14 on the surface of the layer 11.

The staggered stripping away of the individual layers to produce a terrace-shaped opening 14, as in FIG. 7*b*, may also be carried out, using the masks mentioned in reverse order of size, by commencing with the smallest mask and ending with the largest mask.

When the local damage 14 is pretreated in this way, the removed layers can be replaced one after the other. FIG. 7*c* shows the replacement of the bonding layer 11 by a renewed bonding layer 17 which takes place through a mask 24 so as to avoid overlaps. In the same way, a renewed heat insulation layer 18 is also applied (FIG. 7*d*) which is then adapted (FIG. 7*e*) to the remaining surface by grinding and/or polishing. When the component 200 thus repaired is exposed to high temperatures, a newly grown oxide layer 19 (FIG. 7*e*) forms, so that the original layer sequence is restored completely.

Figure 8:
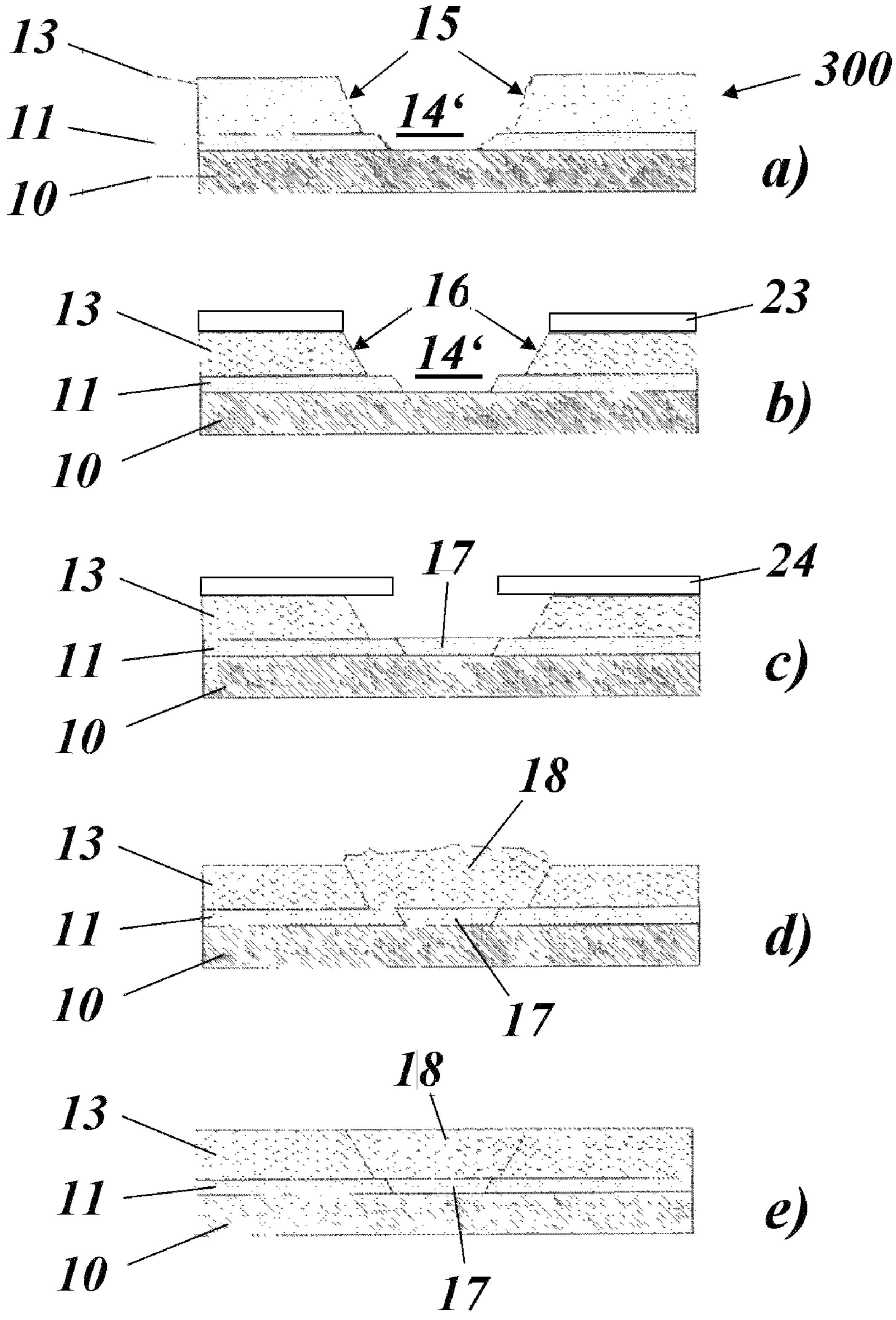
FIG. 8 shows, in various part figures, different steps in the local application on the spot or off-site of a new heat insulation layer for the purpose of refilling a damaged place or a local untreated place.

Whereas FIG. 7 relates to the rectification of local damage 14, FIG. 8 reproduces, in various part figures, different steps in the application of a new heat insulation layer for refilling a local untreated place 14' of a component 300 provided with a BC/TBC heat insulation layer system. Such a local untreated place 14' occurs, for example, in the region of a weld seam when two parts already previously coated are welded to one another. Since such a component 300 has to be processed even before its first use, in order to complete the heat insulation layer, there is not yet here a thermally grown oxide layer present in the layer sequence (FIG. 8*a*). In this case, too, first, the irregular edge regions 15 of the layers 11, 13 are changed to uniformly sloped edge regions 16 through masks 23 by controlled stripping away (FIG. 8*b*). The layers 17 and 18 are then newly applied (FIGS. 8*c* and *d*) through corresponding masks 24 and adapted to the surface (FIG. 8*e*). What is achieved by using plasma spraying or a spraying method which transfers the material to be applied into a fusible or molten phase is that the new layers 17, 18 are applied to the openings 14' according to the mask aperture.

Figure 1:
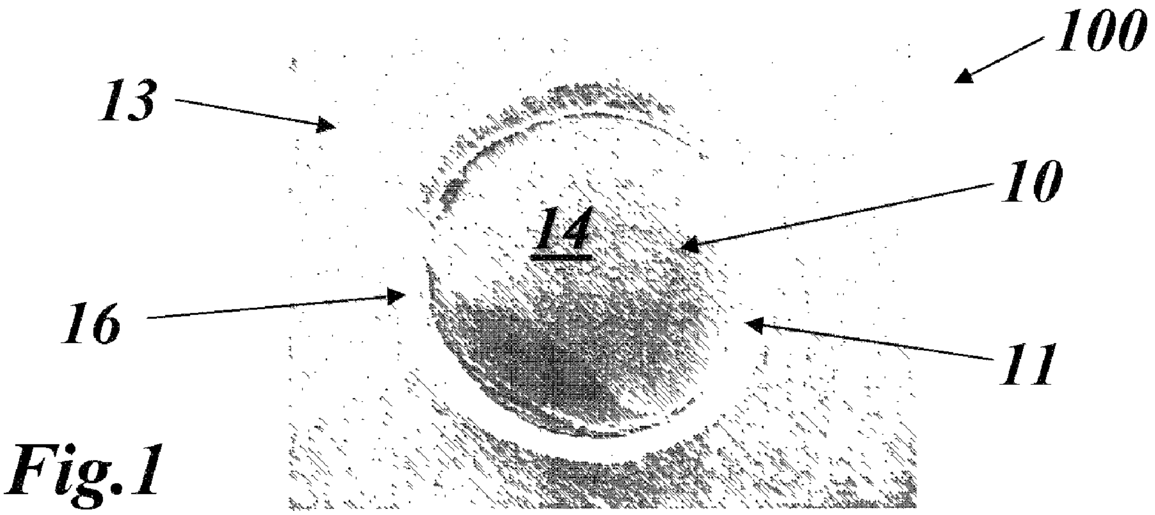
FIG. 1 shows a photographic illustration of a top view of cleaned local damage, prepared by the method according to the invention for recoating, of a component or substrate provided with a heat insulation layer.
Figure 2:
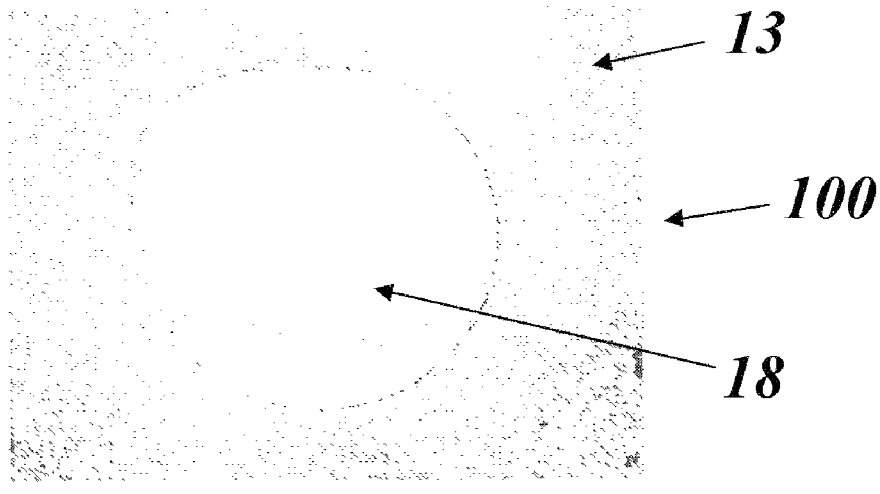
FIG. 2 shows the component from FIG. 1 after the recoating and subsequent treatment of the surface.

A photographic illustration of local damage to a component 100 before the application of the layers and after repair is shown in FIGS. 1 and 2. FIG. 1 shows, in a top view from above, the pretreated local damage 14 with the uncovered basic material 10, the bonding layer 11 and the heat insulation layer 13. The use of masks of the type illustrated in FIG. 3, with circular mask apertures, results, in FIG. 1, in edge regions with a clearly visible uniform slope. FIG. 2 shows the surface, adapted by grinding, of the renewed heat insulation layer 18 after the repair (comparable to FIGS. 7*e* and 8*e*).

The processing of the local damages 14 or untreated places 14' takes place preferably on the installed component "on the spot", blasting processes with ceramic blasting material or sandblasting being used for cleaning (and similar blasting processes) and for stripping away, and, to apply the new layers, spraying methods being used which change the material to be applied into a fusible or molten state, such as, for example, by the plasma, microplasma, laser, or HVOF method.

LIST OF REFERENCE SYMBOLS

10 Basic material
11 Bonding layer
12 Oxide layer (thermally grown)
13 Heat insulation layer
14 Local damage
14' Local untreated place
15 Edge region (untreated)
16 Edge region (sloped)
17 Bonding layer (renewed)
18 Heat insulation layer (renewed)
19 Oxide layer (newly grown)
20 Substrate (component)
21 Mask
22 Mask aperture
23, 24 Mask
25 Overlap
100, 200, 300 Component While the invention has been described in detail with reference to exemplary embodiments thereof, it will be apparent to one skilled in the art that various changes can be made, and equivalents employed, without departing from the scope of the invention. The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for the elimination of local damage or an untreated place in a heat insulation layer or in a metallic protective layer on a component for use under high thermal stress, the component including a basic material, the method comprising:

stripping away edge regions of individual layers of the heat insulation layer one after the other in steps using masks of different sizes, the size of the masks being successively larger or successively smaller from step to step so that the extent of the stripped-away surface of the individual layers of the heat insulation layer decreases or increases, respectively, in steps from an outermost layer of the heat insulation layer of the component to the surface of the basic material;

applying layers necessary for eliminating the local damage or untreated place one after the other using masks of different sizes, the size of the masks being assigned for each individual layer;

wherein stripping away comprises stripping away individual layers in the edge regions of the local damage so that ends of the individual layers are sloped uniformly, and the angle of the slope is essentially identical within a layer and over the extent of the edge regions; and wherein stripping away comprises stripping away the edge regions of the layers by sandblasting or a blasting method with ceramic blasting material.

2. The method as claimed in claim 1 further comprising:

before said stripping away, nondestructively detecting the extent of the local damage;

selecting a region of the local damage; and eliminating said region based on said detecting.

3. The method as claimed in claim 1, wherein said masks comprise a rounded or circular mask aperture.

4. The method as claimed in claim 1, wherein the heat insulation layer or protective metallic layer comprises a heat insulation system including a bonding layer on the basic material and a heat insulation layer on the bonding layer.

5. The method as claimed in claim 1, wherein said stripping away edge regions and said applying layers are performed on components installed in a machine or on components demounted from a machine, and are performed with small portable processing systems.

6. The method as claimed in claim 1, wherein the angle of the slope relative to the surface normal of the component is between 30° and 75°.

7. The method as claimed in claim 6, wherein the angle of the slope relative to the surface normal of the component is about 60°.

8. The method as claimed in claim 1, wherein applying layers comprises applying the layers by plasma spraying or a spraying method which changes the material to be applied into a fusible or molten phase.

9. The method as claimed in claim 8, further comprising:

after said stripping away and before said applying, processing a surface of a layer lying underneath to improve bonding of a layer to be applied.

10. The method as claimed in claim 8, wherein said processing a surface of a layer comprises blasting.

11. The method as claimed in claim 1, further comprising:

after said applying, quality testing a region of previous local damage or untreated place.

12. The method as claimed in claim 11, wherein quality testing comprises nondestructive quality testing.

13. The method as claimed in claim 1, further comprising:

before said stripping away edge regions, examining the surface of the component for mechanical integrity, at least in regions which are at particular risk, including nondestructive testing; and identifying areas to be repaired and defining the extent of the areas to be repaired.

14. The method as claimed in claim 13, wherein nondestructive testing comprises Frequency Scanning Eddy Current Techniques.

15. The method as claimed in claim 1, wherein said small portable processing systems comprise a cleaner and a plasma sprayer.

16. The method as claimed in claim 15, wherein the angle of the slope relative to the surface normal of the component is between 30° and 75°.

17. The method as claimed in claim 16, wherein the angle of the slope relative to the surface normal of the component is about 60°.

18. A method for the elimination of local damage or an untreated place in a heat insulation layer or in a metallic protective layer on a component for use under high thermal stress, the component including a basic material, the method comprising:

stripping away edge regions of individual layers of the heat insulation layer one after the other in steps using masks of different sizes, the size of the masks being successively larger or successively smaller from step to step so that the extent of the stripped-away surface of the individual layers of the heat insulation layer decreases or increases, respectively, in steps from an outermost layer of the heat insulation layer of the component to the surface of the basic material; and applying layers necessary for eliminating the local damage or untreated place one after the other using masks of different sizes, the size of the masks being assigned for each individual layer;

wherein applying layers comprises applying the layers by plasma spraying or a spraying method which changes the material to be applied into a fusible or molten phase.

19. The method as claimed in claim 18, further comprising:

after said stripping away and before said applying, processing a surface of a layer lying underneath to improve bonding of a layer to be applied.

20. The method as claimed in claim 19, wherein said processing a surface of a layer comprises blasting.

21. The method as claimed in claim 20, wherein said blasting comprises sandblasting.

22. A method: for the elimination of local damage or an untreated place in a heat insulation layer or in a metallic protective layer on a component for use under high thermal stress, the component including a basic material, the method comprising:

stripping away edge regions of individual layers of the heat insulation layer one after the other in steps using masks of different sizes, the size of the masks being successively larger or successively smaller from step to step so that the extent of the stripped-away surface of the individual layers of the heat insulation layer decreases or increases, respectively, in steps from an outermost layer of the heat insulation layer of the component to the surface of the basic material;

applying layers necessary for eliminating the local damage or untreated place one after the other using masks of different sizes, the size of the masks being assigned for each individual layer; and after said applying, processing the surface in the region of the previous local damage or untreated place to eliminate unevennesses.

23. The method as claimed in claim 22, wherein said processing comprises grinding, polishing, or both.

24. A method for the elimination of local damage or an untreated place in a heat insulation layer or in a metallic protective layer on a component for use under high thermal stress, the component including a basic material, the method comprising:

stripping away edge regions of individual layers of the heat insulation layer one after the other in steps using masks of different sizes, the size of the masks being successively larger or successively smaller from step to step so that the extent of the stripped-away surface of the individual layers of the heat insulation layer decreases or increases, respectively, in steps from an outermost layer of the heat insulation layer of the component to the surface of the basic material;

applying layers necessary for eliminating the local damage or untreated place one after the other using masks of different sizes, the size of the masks being assigned for each individual layer; and after said applying, quality testing a region of previous local damage or untreated place.

25. The method as claimed in claim 24, wherein quality testing comprises nondestructive quality testing.

26. The method as claimed in claim 25, wherein nondestructive quality testing comprises thermography or Frequency Scanning Eddy Current Technique.

27. A method for the elimination of local damage or an untreated place in a heat insulation layer or in a metallic protective layer on a component for use under high thermal stress, the component including a basic material, the method comprising:

stripping away edge regions of individual layers of the heat insulation layer one after the other in steps using masks of different sizes, the size of the masks being successively larger or successively smaller from step to step so that the extent of the stripped-away surface of the individual layers of the heat insulation layer decreases or increases, respectively, in steps from an outermost layer of the heat insulation layer of the component to the surface of the basic material;

applying layers necessary for eliminating the local damage or untreated place one after the other using masks of different sizes, the size of the masks being assigned for each individual layer;

before said stripping away edge regions, examining the surface of the component for mechanical integrity, at least in regions which are at particular risk, including nondestructive testing; and identifying areas to be repaired and defining the extent of the areas to be repaired.

28. The method as claimed in claim 27, wherein nondestructive testing comprises Frequency Scanning Eddy Current Techniques.

29. A method for the elimination of local damage or an untreated place in a heat insulation layer or in a metallic protective layer on a component for use under high thermal stress, the component including a basic material, the method comprising:

stripping away edge regions of individual layers of the heat insulation layer one after the other in steps using masks of different sizes, the size of the masks being successively larger or successively smaller from step to step so that the extent of the stripped-away surface of the individual layers of the heat insulation layer decreases or increases, respectively, in steps from an outermost layer of the heat insulation layer of the component to the surface of the basic material; and applying layers necessary for eliminating the local damage or untreated place one after the other using masks of different sizes, the size of the masks being assigned for each individual layer;

wherein said stripping away edge regions and said applying layers are performed on components installed in a machine or on components demounted from a machine, and are performed with small portable processing systems; and wherein said small portable processing systems comprise a cleaner and a plasma sprayer.

* * * * *